United States Patent [19]

De Haan

[11] Patent Number: 4,544,918
[45] Date of Patent: Oct. 1, 1985

[54] ANALOG-TO-DIGITAL CONVERSION CIRCUIT

[75] Inventor: Gerard De Haan, Eindhoven, Netherlands

[73] Assignee: U.S. Philips Corporation, New York, N.Y.

[21] Appl. No.: 523,526

[22] Filed: Aug. 17, 1983

[30] Foreign Application Priority Data

Sep. 3, 1982 [NL] Netherlands .................. 8203446

[51] Int. Cl.[4] ............................................ H03K 13/02
[52] U.S. Cl. ........................ 340/347 AD; 340/347 M
[58] Field of Search .................. 340/347 AD, 347 M

[56] References Cited

U.S. PATENT DOCUMENTS

| 3,516,085 | 6/1970 | Dano | 340/347 AD |
| 3,541,315 | 11/1970 | Naydan et al. | 340/347 M |
| 4,074,257 | 2/1978 | Henry | 340/347 AD |
| 4,199,812 | 4/1980 | Klötzner et al. | 364/431.05 |
| 4,245,297 | 1/1981 | Bertram | 318/601 X |

Primary Examiner—B. Dobeck
Attorney, Agent, or Firm—Thomas A. Briody; William J. Streeter; Edward W. Goodman

[57] ABSTRACT

An analog-to-digital conversion circuit, in which the coarse bits are produced by a counter (25), is made suitable for processing a video signal by having, in the event of fast large amplitude variations, an analog-to-digital converter (3), connected to the input (1) of the conversion circuit, write into the counter in response to a threshold-crossing signal produced by a difference threshold circuit (91, 93, 57), while slow and small amplitude variations are followed by a correction circuit (97, 113, 111, 119, 61, 63) coupled to an output (49) of a digital-to-analog converter (47) which is connected to the outputs of the conversion circuit, the correction circuit also being coupled to the input (1) of the conversion circuit, which correction circuit corrects the counting position, while the fine bits are obtained from a fine analog-to-digital converter (113, 97, 103, 105) which is responsive to the difference between the signal at the input (1) of the conversion circuit and the signal at the output (49) of the digital-to-analog converter (47).

5 Claims, 2 Drawing Figures

ANALOG-TO-DIGITAL CONVERSION CIRCUIT

BACKGROUND OF THE INVENTION

The invention relates to an analog-to-digital conversion circuit comprising an analog-to-digital converter having an input and a plurality of outputs, a counter having counting position outputs to which are connected conversion circuit outputs for most significant bits of a signal converted by the conversion circuit, a digital-to-analog converter coupled to the counting position outputs and a difference threshold circuit coupled to an input of the conversion circuit and to an output of the digital-to-analog converter an output of the difference threshold circuit being coupled to the counter for applying thereto a threshold-crossing signal when the difference between an analog signal to be converted and the output signal of the digital-to-analog converter is too large.

U.S. Pat. No. 3,516,085 discloses an analog-to-digital conversion circuit of the above-mentioned type in which the difference between the input signal of the conversion circuit and the output signal of the digital-to-analog converter is applied to the input of the analog-to-digital converter and the output of the difference threshold circuit is connected to an input of the counter which determines whether the counter is to count up or down. When this counter is used, the number of bits in the output signal combination of the conversion circuit is increased without the necessity of extending the analog-to-digital converter.

SUMMARY OF THE INVENTION

It is an object of the invention to provide an analog-to-digital conversion circuit which is particularly suitable for processing video signals while maintaining the advantage that it is not necessary to extend the analog-to-digital converter therein to obtain a larger number of bits in the output signal combination than the analog-to-digital converter is capable of producing.

According to the invention, an analog-to-digital conversion circuit of the type set forth in the opening paragraph, is characterized in that the input of the analog-to-digital converter is connected to the input of the conversion circuit and that its outputs are connected to counting position inputs of the counter, while the output of the difference threshold circuit is connected to a counting position writing input of the counter and a fine analog-to-digital converter is coupled to the input of the conversion circuit and to the output of the digital-to-analog converter, outputs of this fine analog-to-digital converter being coupled to further inputs of the digital-to-analog converter and to outputs of the conversion circuit for the least signifant bits of the converted signal, while a counting signal input combination of the counter is coupled to the output combination of the correction circuit for correcting the counting position for slow amplitude variations of the analog signal to be converted, an input of this correction circuit being coupled to the output of the digital-to-analog converter and an input being coupled to the input of the conversion circuit.

Because of these measures in accordance with the invention, the conversion circuit is particularly suitable for processing a video signal, as the counter immediately starts supplying the coarse bits at the occurrence of sudden transients in the video signal. The fine bits are then not available, but this is not important as in the event of sudden transients the accuracy of the conversion is not so important. In the event of small signal amplitude variations and after the occurrence of a sudden transient the conversion is accurately readjusted by the fine analog-to-digital converter.

DESCRIPTION OF THE DRAWINGS

The invention will now be further described, by way of example, with reference to the accompanying drawings.

In the drawings.

DESCRIPTION OF THE PREFERRED EMBODIMENTS

Figure 1:
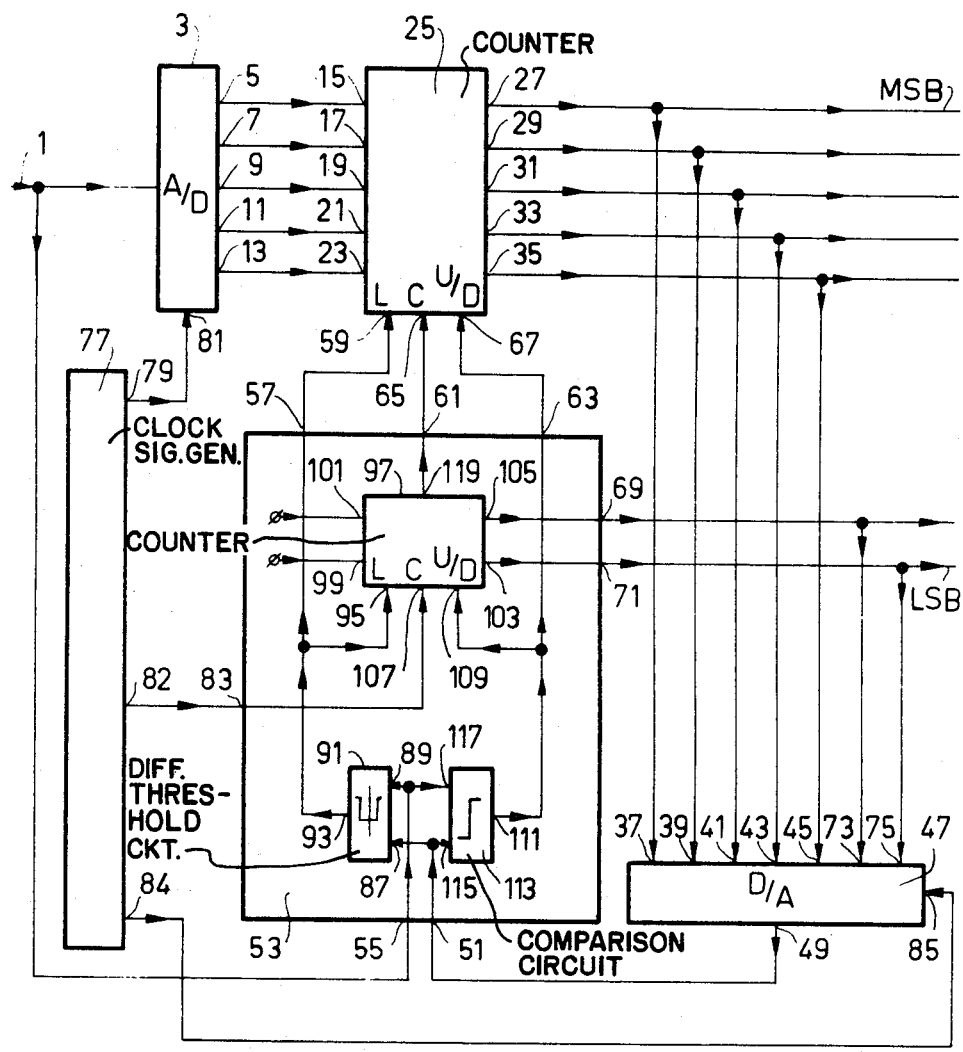
FIG. 1 illustrates, by means of a block diagram, a possible construction of an analog-to-digital conversion circuit in accordance with the invention.

In FIG. 1, an analog video signal to be converted is applied to an input 1 of the conversion circuit. The input 1 is also the input of an analog-to-digital converter 3, an output combination 5, 7, 9, 11, 13 of which is connected to a combination of counting position inputs 15, 17, 19, 21, 23 of a counter 25.

The counter 25 has a combination of counting position outputs 27, 29, 31, 33, 35 which also form outputs MSB of the conversion circuit for the most significant bits of a converter signal and which are further connected to a number of inputs 37, 39, 41, 43, 45 of a digital-to-analog converter 47.

An output 49 of the digital-to-analog converter 47 is connected to an input 51 of a multi-function circuit 53, which has a further input 55 connected to the input 1 of the conversion circuit, an output 57 connected to a counting position writing input 59 of the counter 25 and two outputs 61, 63 connected to a counting signal input combination 65, 67 of the counter 25. The input 65 is a counting signal input and the input 67 is an input for a signal which determines whether the counter 25 is to count up or down.

In addition, the multi-function circuit 53 has two outputs 69, 71, which also form outputs LSB of the conversion circuit for the least significant bits of the converted signal and which are further connected to two inputs 73 and 75 of the digital-to-analog converter 47.

The digital-to-analog converter 47 converts all the bits of an output signal combination of a converted signal into an analog signal, which becomes available at the output 49.

In addition, the conversion circuit comprises a clock signal generator 77 having an output 79 which applies a clock signal to an input 81 of the analog-to-digital converter 3, an output 82 which applies to an input 83 of the multi-function circuit 53 a clock signal, which in this case is produced simultaneously with the clock signal at the output 79 of the clock signal generator 77, and an output 84 which applies to an input 85 of the digital-to-analog converter 47 a clock signal whose phase is, in this case, shifted relative to that of the signals at the outputs 79 and 82. Generally, the phase of the clock signals will have to be adapted to the components used.

The inputs 51 and 55 of the multi-function circuit 53 are connected respectively to inputs 87 and 89 of a difference threshold circuit 91, an output 93 of which is connected to the output 57 of the multi-function circuit 53. The difference threshold circuit 91 produces a threshold-crossing signal when the absolute value of the difference at its inputs 87 and 89 is, for example, higher than a value equivalent to the maximum value of the bits supplied by the outputs 69 and 71 of the multi-function circuit 53 or, optionally, higher than a somewhat higher value in the event there are noise problems. This is the case with sudden amplitude transients of the input signal higher than that equivalent of the maximum value of those bits or higher than the equivalent of the said somewhat higher value.

In that event the counter 25 assumes a position which is determined by the output signal combination of the analog-to-digital converter 3.

The threshold-crossing signal at the output 93 of the difference threshold circuit 91 is further applied to a counting position-writing input 95 of a second counter 97, two counting position inputs 99 and 101 of which are in this case both zero, but which are optionally supplied with a different combination. This second counter 97 is adjusted to the zero position, which zero position then also occurs at two counting position outputs 103 and 105 connected to the outputs 71 and 69 of the multi-function circuit 53.

A counting signal input 107 of the second counter is connected to the clock signal input 83 of the multi-function circuit 53, and a counting direction input 109 of the second counter is connected to an output 111 of a comparison circuit 113, to which also the output 63 of the multi-function circuit 53 is connected. The comparison circuit 113 has two inputs 115 and 117 which are respectively connected to the inputs 51 and 55 of the multi-function circuit 53. The output 61 of the multi-function circuit 53 is connected to an overflow signal output 119 of the second counter 97.

At its output 111, the comparison circuit 113 supplies a logic zero or one signal, depending on whether the difference between the signals at its inputs 115 and 117 is negative or positive. In response thereto, the counters 97 and 25 then correct step-wise, under the control of the clock signal at the input 107, the output signal combination of the conversion circuit and consequently the output signal of the digital-to-analog converter 47, until the difference at the inputs 51 and 55 of the multi-function circuit 53 is minimal. Slow signal amplitude variations at the input 1 are then accurately followed in the output signal combination.

The second counter 97 then forms, by means of its outputs 103 and 105 and the comparison circuit 113, a fine analog-to-digital converter, while the second counter 97 forms a correction circuit by means of its output 119 and the comparison circuit 113.

Figure 2:
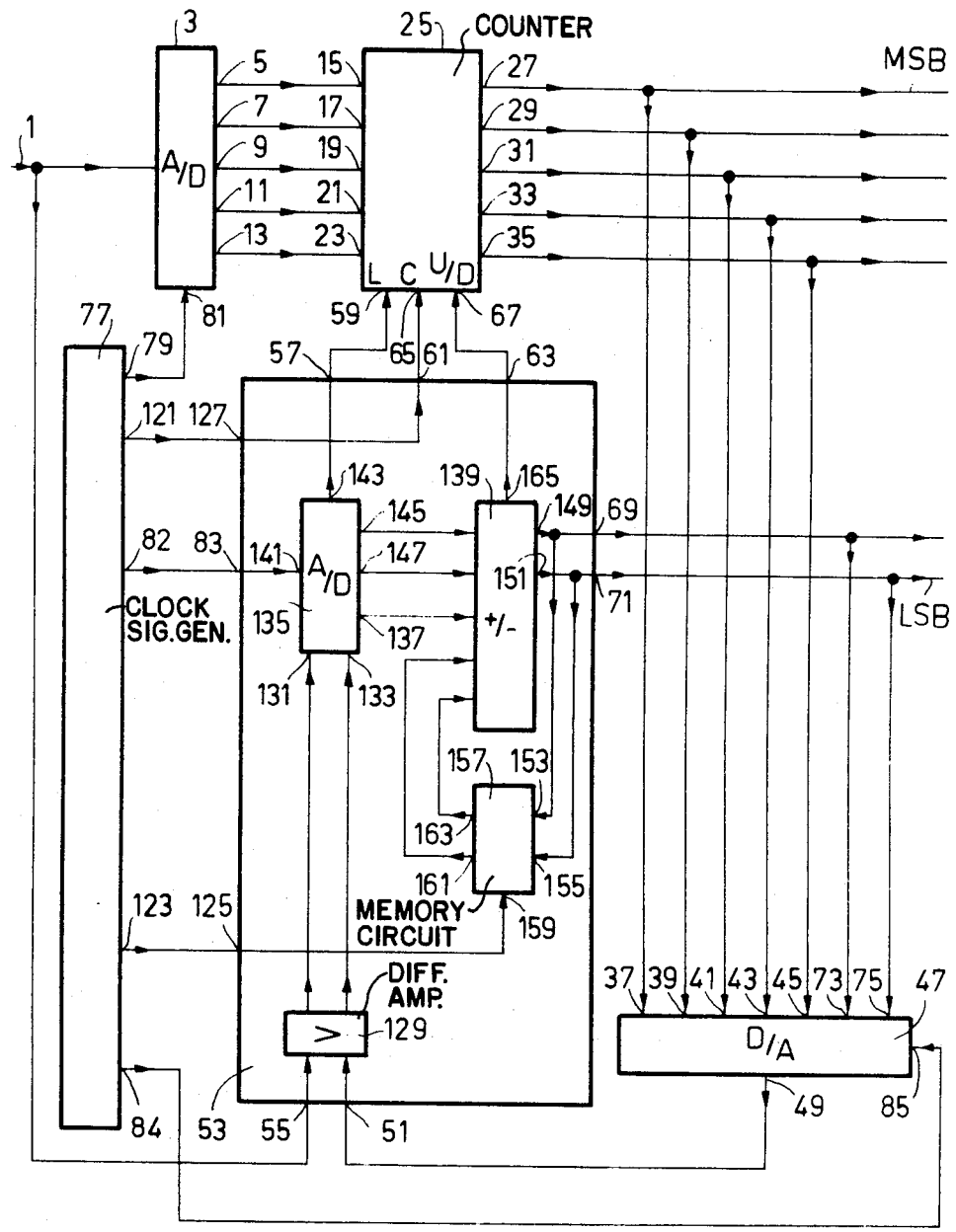
FIG. 2 illustrates, also by means of a block diagram, a further possible embodiment of an analog-to-digital conversion circuit in accordance with the invention.

In FIG. 2 corresponding components have been given the reference numerals as in FIG. 1.

The only difference between the circuits of FIG. 2 and of FIG. 1 is in the construction of the multi-function circuit 53. Therefore, only this multi-function circuit will be described in detail hereinafter.

The clock signal generator 77 has two additional outputs 121 and 123 applying clock signals to two inputs 125 and 127 of the multi-function circuit 53. The input 127 of the multi-function circuit 53 is through-connected to its output 61. The clock signal at the output 123 is in anti-phase with the clock signals at the other outputs of the clock signal generator 77. Generally, the phase of the clock signals will have to be adapted to the components used.

The inputs 51 and 55 of the multi-function circuit 53 form the inputs of a differential amplifier 129 having a gain factor $2^a$, wherein a is the number of bits produced by the analog-to-digital converter 3, which in this case is five bits. Two outputs of this differential amplifier 129 are connected to two inputs 131 and 133 of a second analog-to-digital converter 135, which is capable of processing signals having both a negative and a positive polarity and, depending on that polarity, applies at an output 137 a sign signal to an adding and subtracting circuit 139.

A clock signal input 141 of the second analog-to-digital converter 135 is connected to the clock signal input 83 of the multi-function circuit 53.

The second analog-to-digital converter 135 applies to an output 143, which is connected to the output 57 of the multi-function circuit 53, an overload signal which serves as a threshold-crossing signal when the amplitude difference between the signals at its inputs 131 and 133 is, for example, larger than the maximum equivalent value of the bits in the output signal combination of the conversion circuit supplied from the outputs 69 and 71 of the multi-function circuit 53, or larger than a somewhat higher value in the event of noise problems. As was also the case in the circuit shown in FIG. 1, the counter 25 then assumes a position determined by the output combination of the analog-to-digital converter 3.

The second analog-to-digital converter 135 supplies at two outputs 145 and 147 a digital signal combination converted by this second converter, which signal combination is applied to the adding and subtracting circuit 139.

Two outputs 149 and 151 of the adding and subtracting circuit 139 are connected to the outputs 69 and 71 of the multi-function circuit 53 and to two inputs 153 and 155 of a memory circuit 157, a clock signal input 159 of which is connected to the clock signal input 125 of the multi-function circuit 53. Two outputs 161 and 163 of the memory circuit 157 are connected to respective inputs of the adding and subtracting circuit 139.

In addition, the adding and subtracting circuit 139 has a carry and borrow output 165, which is connected to the output 63 of the multi-function circuit 53 and produces a signal when the sum of an adding operation is larger than a value corresponding to the highest value of the number represented by the bits of the digital signal combination at the outputs 149 and 151, or when the difference of a subtracting operation is less than a value corresponding to the lowest value of the number represented by the bits of that digital signal combination.

The adding and subtracting circuit 139 adds the digital signal combination at the outputs 145 and 147 of the second analog-to-digital converter 135 to the digital signal combination at the outputs 161 and 163 of the memory circuit 157 when the sign signal at the output 137 of the analog-to-digital converter 135 corresponds to a positive value and subtracts them from each other when the sign signal corresponds to a negative value.

In this case, the fine analog-to-digital converter is provided by the second analog-to-digital converter 135 with its outputs 145, 147 and 137, the adding and subtracting circuit 139 with its outputs 149 and 151, and the memory circuit 157.

In this case, the correction circuit is provided by the fine analog-to-digital converter 135, 139, 157 in combination with the output 165 of the adding and subtracting circuit 139.

The circuit operates as follows:

The situation in which the digital output combination of the circuit has a value corresponding to the value of the analog input voltage is the starting point. No voltage is then produced by the differential amplifier 129.

If now the voltage at the input decreases somewhat, the differential amplifier 129 will produce a voltage proportional to the difference between the input and output values of the conversion circuit. The second analog-to-digital converter 135 converts this difference into a sign signal at its output 137 which indicates that the output value of the conversion circuit must be reduced, and into a digital value at its outputs 145 and 147 which produces the amount by which the output value must be reduced and which in this case must consequently be subtracted from the value at the outputs 161 and 163 of the memory circuit 137 by the adding and subtracting circuit 139. If the result of this subtracting operation produces an amount less than zero, then, in addition, the output 165 of the adding and subtracting circuit 139 applies a signal to the input 67 of the counter 25 in response to which the counting position is decreased by one step. In this way the output value of the conversion circuit is made equal again to its input value.

If now the voltage at the input 1 increases somewhat, then the difference between the output and the input values is converted by the differential amplifier 129 and the second analog-to-digital converter 135 into a digital value at the outputs 145 and 147 and into a sign signal at the output 137 which indicates that the adding and subtracting circuit 139 must add this digital value to the values at the outputs 161 and 163 of the memory circuit 157. Should this adding operation produce an amount larger than three, then, in addition, the output 165 of the adding and subtracting circuit 139 applies a signal to the input 67 of the counter 25 which in response thereto is advanced one step. In this way the output value of the conversion circuit is again made equal to the input value.

If the voltage at the input 1 evidences a large sudden transient, then, as described in the foregoing, the output 143 of the second analog-to-digital converter 135 applies a signal to the input 59 of the counter 25 as a result of which this counter 25 assumes the output value of the analog-to-digital converter 3. As a result thereof the most significant bits of the output value get immediately the correct value and the least significant bits are thereafter readjusted in the manner described in the foregoing.

It will be clear that optionally the ratio between the number of bits produced by the counter 25 and the number of bits produced by the multi-function circuit 53 may be chosen to be different from the number produced in the embodiments described which also applies to the total number of bits in the output signal combination.

Obviously, if so desired, the second counter 97 of the first embodiment may be combined with the counter 25 to form one single counter.

What is claimed is:

1. An analog-to-digital conversion circuit comprising:

an analog-to-digital converter having an input coupled to an input of the conversion circuit for receiving an input signal to be converted, and a plurality of outputs;

a counter having counting position inputs coupled, respectively, to the plurality of outputs of said analog-to-digital converter, and counting position outputs coupled to respective outputs of the conversion circuit for forming the most significant bits of an output signal from the conversion circuit;

a digital-to-analog converter having inputs coupled, respectively, to the counting position outputs of said counter, and an output; and a difference threshold circuit having a first input for receiving the input signal to the conversion circuit, and a second input coupled to the output of said digital-to-analog converter, said difference threshold circuit having an output coupled to a counting position writing input of said counter for supplying thereto a signal when the difference between said input signal and the output of said digital-to-analog converter is larger than a predetermined value; characterized in that said analog-to-digital conversion circuit further comprises:

a fine analog-to-digital converter having inputs for receiving said input signal and the output from said digital-to-analog converter, and outputs coupled to further inputs of said digital-to-analog converter and to further outputs of the conversion circuit for forming the least significant bits of said output signal of the conversion circuit; and a correction circuit having inputs for receiving said input signal and the output of said digital-to-analog converter, and outputs coupled to a further input combination of said counter for correcting the counting position thereof for slow amplitude variations of the input signal to be converted, whereby, depending on the magnitude of said slow variations, said fine analog-to-digital converter provides an output signal indicative of this variation and said correction circuit causes said counter to update the output signal therefrom when said variations exceed a certain magnitude, and upon fast amplitude variations, said difference threshold circuit causes said counter to assume the output signal of said analog-to-digital converter and thereafter said fine analog-to-digital converter and said correction circuit modify the output signal of the conversion circuit accordingly.

2. A conversion circuit as claimed in claim 1, characterized in that the fine analog-to-digital converter comprises a second counter and a comparison circuit.

3. A conversion circuit as claimed in claim 1, characterized in that the fine analog-to-digital converter comprises a second analog-to-digital converter, an adding and subtracting circuit coupled to an output of said second analog-to-digitgal converter, and a memory circuit coupled between outputs of and further inputs of said adding and subtracting circuit.

4. A conversion circuit as claimed in claim 3, characterized in that the fine analog-to-digital converter includes said difference threshold circuit and has an output for providing the threshold-crossing signal.

5. A conversion circuit as claimed in claim 3, characterized in that the adding and subtracting circuit has an output for applying a signal to an input of the input combination of the counter.

* * * * *